(12) United States Patent
Shah et al.

(10) Patent No.: US 8,120,350 B2
(45) Date of Patent: Feb. 21, 2012

(54) CLAMP METER WITH SAFE TRIGGER MECHANISM

(75) Inventors: Tushar Gajkumar Shah, Nashik (IN); Kuldeep Himmatrao Shahane, Nashik (IN); Amol Ashokrao Deshmukh, Nashik (IN)

(73) Assignee: Rishabh Instruments Pvt. Ltd., Nashik, Maharashtra (IN)

( * ) Notice: Subject to any disclaimer, the term of this patent is extended or adjusted under 35 U.S.C. 154(b) by 208 days.

(21) Appl. No.: 12/599,019

(22) PCT Filed: May 13, 2008

(86) PCT No.: PCT/IN2008/000296
§ 371 (c)(1),
(2), (4) Date: Nov. 5, 2009

(87) PCT Pub. No.: WO2009/004647
PCT Pub. Date: Jan. 8, 2009

(65) Prior Publication Data
US 2010/0148756 A1   Jun. 17, 2010

(30) Foreign Application Priority Data
May 18, 2007 (IN) ............................ 931/MUM/2007

(51) Int. Cl.
*G01R 1/20* (2006.01)
*G01R 15/18* (2006.01)
*G01R 1/38* (2006.01)

(52) U.S. Cl. .......................... 324/126; 324/127; 324/115
(58) Field of Classification Search .................. 324/126, 324/127, 99 D, 115, 121 R, 141–142, 133, 324/156, 72.5, 76.82, 76.11; 340/660; 439/822, 439/858
See application file for complete search history.

(56) References Cited

U.S. PATENT DOCUMENTS

| | | | |
|---|---|---|---|
| 4,283,677 A | 8/1981 | Niwa | |
| 5,610,512 A | 3/1997 | Selcuk | |
| 5,634,246 A | 6/1997 | Jermyn | |
| 6,091,237 A * | 7/2000 | Chen | 324/142 |
| 6,456,060 B1 * | 9/2002 | Wiesemann | 324/127 |
| 6,975,104 B2 | 12/2005 | Gregorec | |

FOREIGN PATENT DOCUMENTS

| | | |
|---|---|---|
| IN | 931/MUM/2007 | 3/2009 |
| WO | PCT/IN2008/000296 | 1/2009 |

* cited by examiner

*Primary Examiner* — Huy Q Phan
*Assistant Examiner* — Tung X Nguyen

(57) ABSTRACT

This invention provides a clamp meter with safe trigger mechanism which allows an operator to take electrical measurements of the conductors safely, particularly in case of the electrical conductor elements situated in congested or awkward locations and positions. In the preferred embodiment of the present invention, the trigger is placed at the underside of said clamp meter so as to allow convenient access to it for the fingers of a hand while the clamp meter is held in the hand. The trigger mechanism of the invention may be operated with single or multiple fingers. The invention also allows the hand to maintain its 'clinched-fist' position throughout the measurement process, thereby eliminating the need to open the hand any time during the process. The invention thus makes the electrical parameter measurement operation using clamp meters safer than for the conventional meters.

10 Claims, 7 Drawing Sheets

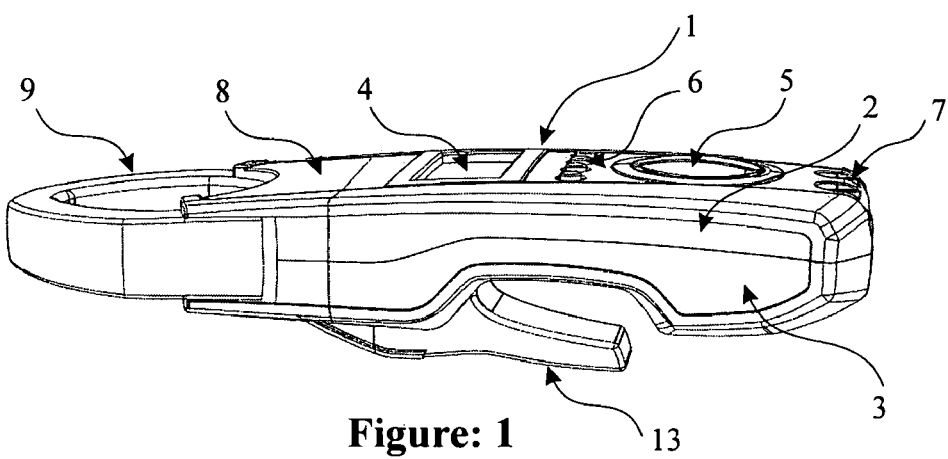
Figure: 1
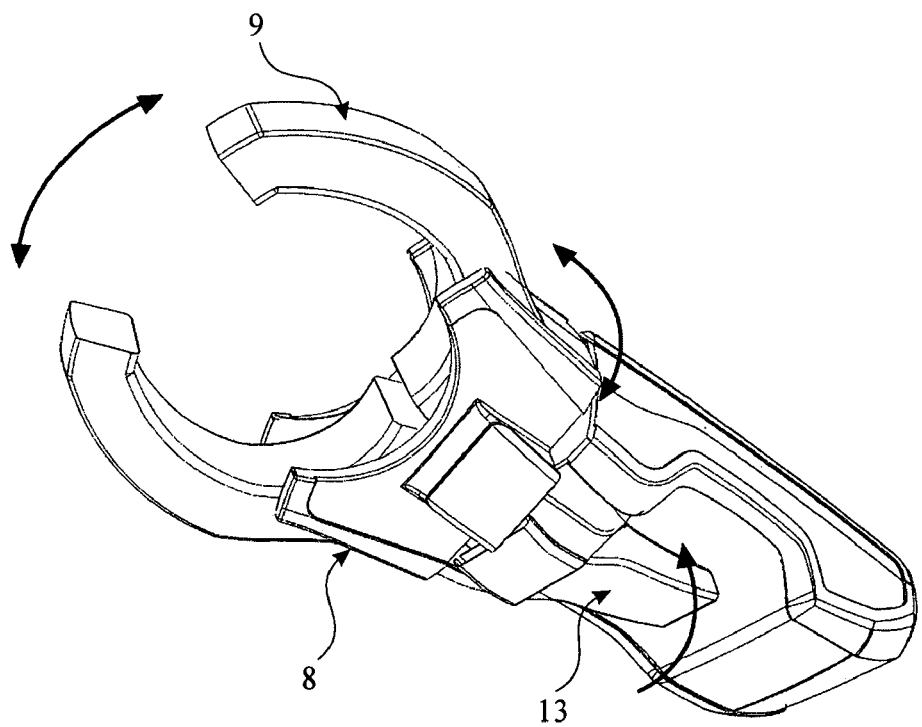
Figure: 2

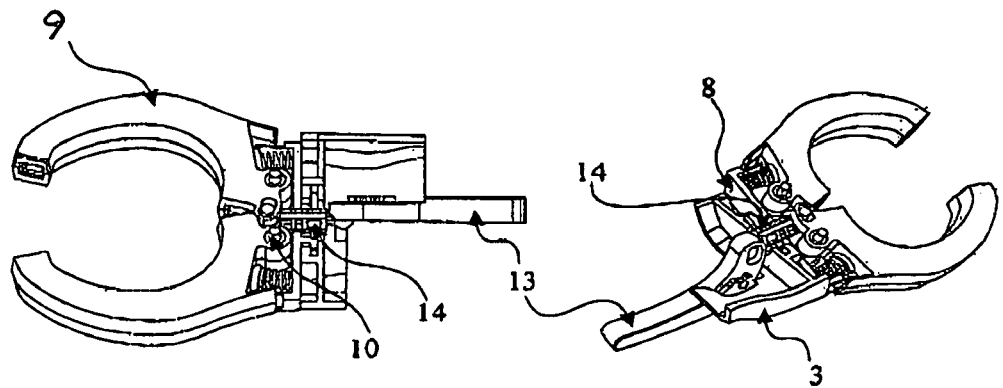
Figure: 3
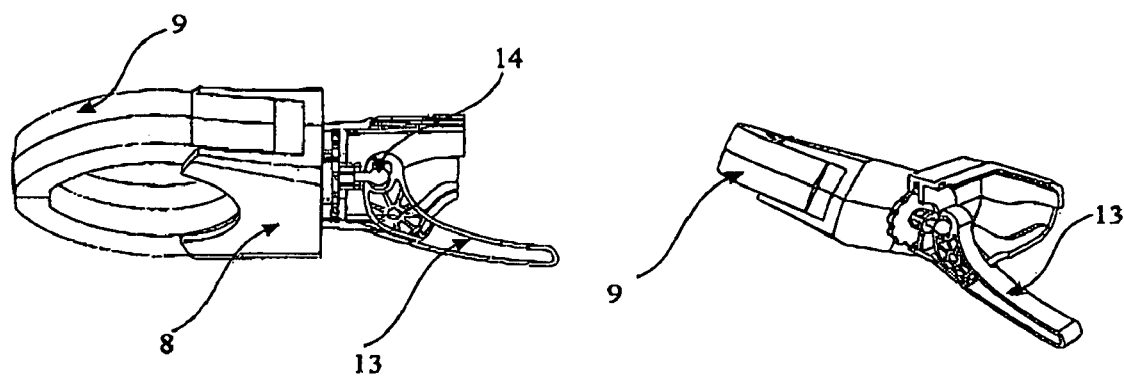
Figure 4
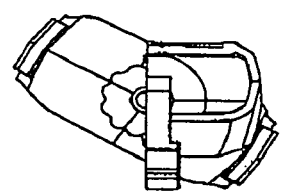
Figure 5

CLAMP METER WITH SAFE TRIGGER MECHANISM

CROSS REFERENCE TO RELATED APPLICATIONS

This application is a 371 National Stage entry of PCT/IN2008/000296, filed on May 13, 2008, which claims priority to Indian Patent Application Number 931/MUM/2007, filed on May 18, 2007.

FIELD OF THE INVENTION

This invention relates generally to electrical and electronic test and measuring instruments for measuring electrical current and particularly relates to multi meters that include clamp meters for the electrical current measurement.

BACKGROUND OF THE INVENTION

Multimeters are used to measure a variety of electrical parameters such as AC voltage, AC current, DC voltage, DC current, and resistance. Clamp meters are a type of multimeters with a current sensing clamp.

Clamp meters are designed to measure current without breaking the current path and typically have two clamp jaws which open and close at a fixed position with respect to the body and display of the clamp meter. Current is measured by opening the jaws to close them around the conductor element carrying the current. The clamps are provided with electrical coils inside them. In the closed position of the clamp jaws, the current flowing in the conductor element (such as a busbar or a cable), of an electrical circuit magnetically induces current in the coils. This current is proportional to the current flowing through the conductor element. For measuring the electrical current, there does not need to be a electrical contact between the conductor element and the clamps.

The conventional clamp meters have a rectangular housing designed to be held in one hand. A pair of clamp jaws extends from one end of the housing. A trigger is provided to operate the opening and closing of the clamps in order to access the conductor whose measurement is to be taken. In conventional clamp meters, the clamp jaws can be opened and closed with a thumb operated lever which is present just below one of the two clamp jaws that are present in these clamp meters. The opening of clamp jaws may require substantial force. This can cause fatigue to the hand of the operator as all the force required to open the clamp jaws for enclosing the conductor is sustained by the thumb.

A drawback of the existing clamp meters is they are awkward to use in many circumstances. For example, there are many situations where the conductor elements that need monitoring are tightly and awkwardly placed in congested physical configurations, or placed in an overhead location, thereby making it awkward to work with them. Under these circumstances, when the clamp jaws are placed around conductor, the display and the keys might be orientated into a position which makes reading the display and operation of the clamp meter very difficult if not impossible.

The operator of the clamp meter tries, under such circumstances, either to take a reading by putting at risk their personal safety or they may not take any measurements at all on the grounds of lack of safe access to the conductor element.

As a further drawback of the existing clamp meters, as the thumb-operated lever is very close to the clamps, user is exposed to dangerously high voltage when measuring the current in the live and often bare conductor elements. When accessing conductors situated in congested or awkward locations, there is also a possibility that the clamp may slip accidentally and user may touch the live conductor and get electrocuted and thus could suffer serious injuries or fatality. This poses a definite risk to the property which houses the electric panels that contain such electric conductor elements.

There is therefore a need to provide a mechanism by which it will be possible for the operator to operate a clamp meter with the use of less hand movement than required by the existing clamp meters, thereby enabling them to operate the clamp meter with greater safety than in case of the existing clamp meters. There is also a need to provide a clamp meter that can be operated with lesser force than required for the existing clamp meters, thereby reducing the fatigue that the operator experiences under such working conditions.

Clamp meter with safe trigger mechanism invention relates to measurement of current in the live bare conductor with trigger mechanism at the bottom side and away from the clamps to reduce the possibility of electric shock and operation of the trigger with more than one finger for reducing the fatigue to the operator.

OBJECTS & ADVANTAGES OF THE INVENTION

The primary object of the present invention is to provide clamp meters with safe trigger mechanism for taking current measurements with great amount of safety and low fatigue to the user.

One advantage of the present invention is that the clamp jaws can be opened or closed with the trigger placed at the bottom side which is a safe location as it allows the operator to place his hand as far away from the live conductor as possible. The danger of exposing human beings to electric shocks is minimized due to such innovative design.

Another advantage of the present invention is that as the trigger mechanism is at the bottom side, it can be opened or closed with more than one finger. The operation of trigger becomes easy as it is possible to spread the force required to open the clamp jaws over more than one finger. This greatly reduces the user fatigue caused by a continued single-finger operation of the clamp meter.

BRIEF DESCRIPTION OF DRAWINGS

FIG. 1 is a perspective view showing one embodiment of a Clamp meter with safe trigger mechanism of the present invention with clamps closed and trigger at normal position.

FIG. 2 is a rear view showing one embodiment of a Clamp meter with safe trigger mechanism of the present invention with clamps opened and trigger pressed.

FIG. 3 is a rear view showing one embodiment of a Clamp meter with safe trigger mechanism of the present invention with clamps opened, clamps rotated at an angle (Clock wise) and trigger pressed FIG. 4 is a cut view showing trigger mechanism.

FIG. 5 is a partial view showing at an angle.

SUMMARY OF THE INVENTION

Figure 6:
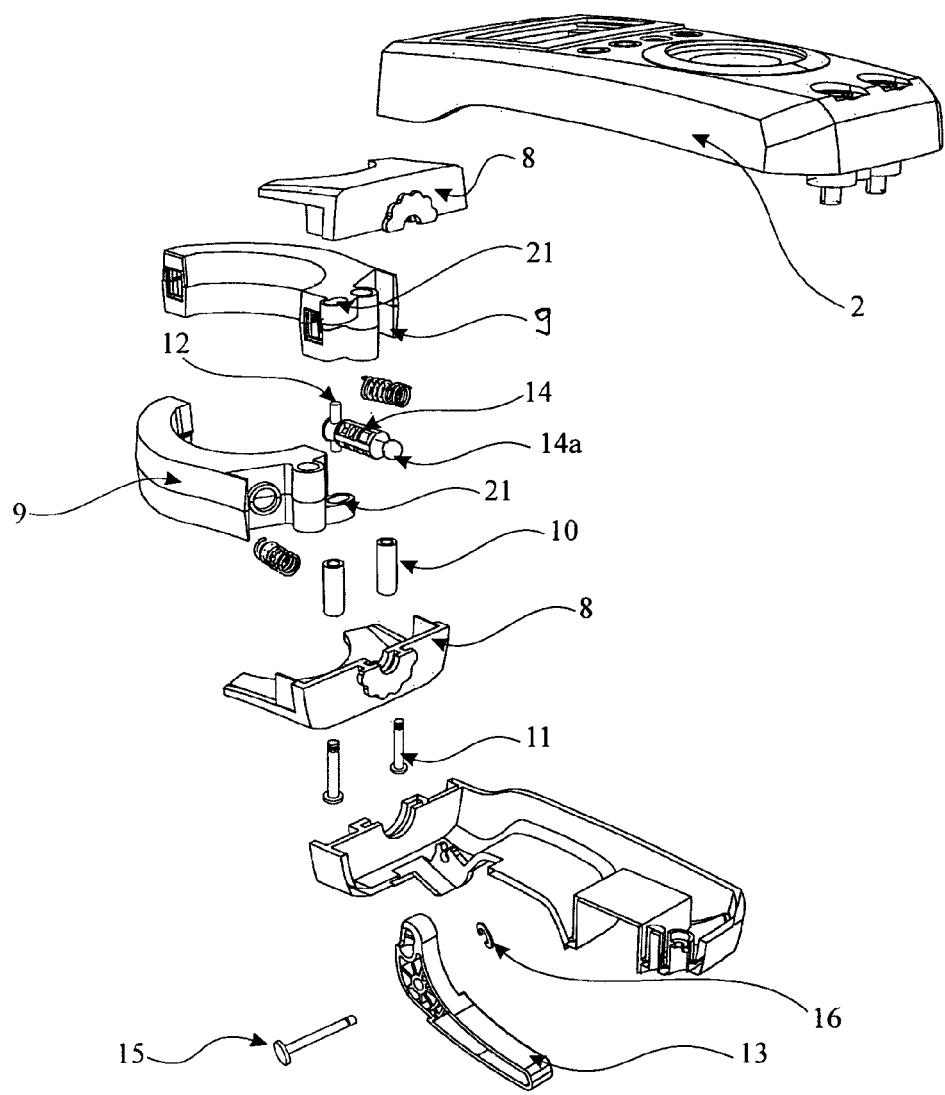
FIG. 6 is an exploded view of rotary Clamp mechanism

This invention provides a clamp meter with safe trigger mechanism which allows an operator to take electrical measurements of the conductors safely, particularly in case of the electrical conductor elements situated in congested or awkward locations and positions. In the preferred embodiment of the present invention, the trigger is placed at the underside of said clamp meter so as to allow convenient access to it for the fingers of a hand while the clamp meter is held in the hand. The trigger mechanism of the invention may be operated with single or multiple fingers. The invention also allows the hand to maintain its 'clinched-fist' position throughout the measurement process, thereby eliminating the need to open the hand any time during the process. The invention thus makes the electrical parameter measurement operation using clamp meters safer than for the conventional meters.

LIST OF PARTS

Main body (1)
Cover Housing (2)
Base housing (3)
Display screen (4)
Function selection switch (5)
Set of push buttons (6)
Two input terminals (7)
Clamp housing (8)
Clamp jaws (9)
Pivot sleeve (10)
Pivot screw (11)
Pin (12)
Trigger (13)
Pusher (14)
Hinge screw (15)
Hinge C- clip (16)

DETAILED DESCRIPTION OF THE INVENTION

The present invention provides a clamp meter that has a safe trigger (13) for operating the clamps of a clamp meter. The trigger mechanism may be used in the current non-rotary type clamp meters, where the clamp jaws (9) do not rotate out of their own plane. The trigger mechanism of the present invention may also be used in the rotary type clamp meters where the clamp jaws (9) are able to rotate out of their own plane.

Referring to FIG. 1, the main body (1) of the clamp meter of the present invention is made of cover housing (2) and a base housing (3), the two housings enclosing the measurement circuitry and some of the other parts of the clamp meter. A display screen (4), a function selection switch (5), and a set of push buttons (6) to select testing parameters are housed within the housings and electrically connected to the measurement circuitry. Two input terminals (7) are also provided for connecting the test leads.

FIG. 2 shows the underside of the clamp meter of the present invention that has a safety trigger mechanism. It also shows the optional rotary feature to rotate the jaws relative to the plane of the main body (1) of the clamp meter. In one embodiment of the present invention, the clamp meter with the safety trigger (13) is provided without the rotary mechanism, and the clamp jaws (9) are fixed in a plane that is at different from the plane of the main body (1) of the clamp meter.

As shown in FIGS. 1, 2, and 6, a clamp housing (8) houses clamp jaws (9). Clamp jaws (9) are connected to the clamp housing (8) through an arrangement comprising a pivot sleeve (10) and pivot screw (11) for each of the clamps. The two jaws are connected to each other through a central hinge arrangement wherein each of the jaws have a loop that are positioned axially, through which a pin (12), made out of metal or any other suitable material such as hard plastic, hard rubber, or wood, passes to form the hinge arrangement.

As shown in FIGS. 2, 3, 4, and 5, a trigger (13) is used to operate the clamp jaws (9) into their open and close positions. The trigger (13) is hinge-connected to the main body (1) of the clamp meter by connecting it with a hinge to the base housing (3). A hinge screw (15) and a hinge C-clip (16) is used for this purpose. The protruding end of the trigger (13) is used by the operator to activate the trigger (13). The hinge end of the trigger (13) is in contact with the ball end of a pusher (14), also known as the trigger-end. The other end of the pusher (14) is connected to the clamp jaws (9) with the help of the pin (12) that operates the clamp jaws (9).

When pressed, the trigger (13) pushes the spherical end of a pusher (14). The pin (12) is fixedly attached to the other end of the pusher (14). When the trigger (13) is pressed, the pusher (14) gets pushed along its axis, thereby moving the pin (12) in the same direction. The pin (12), through the central hinge arrangement, makes the clamp jaws (9) rotate in their own plane, thereby opening them. In their open position, the clamp jaws (9) press against the compression springs. Upon the release of the trigger (13), the compression springs push the clamp jaws (9) back into their closed position.

Figure 7:
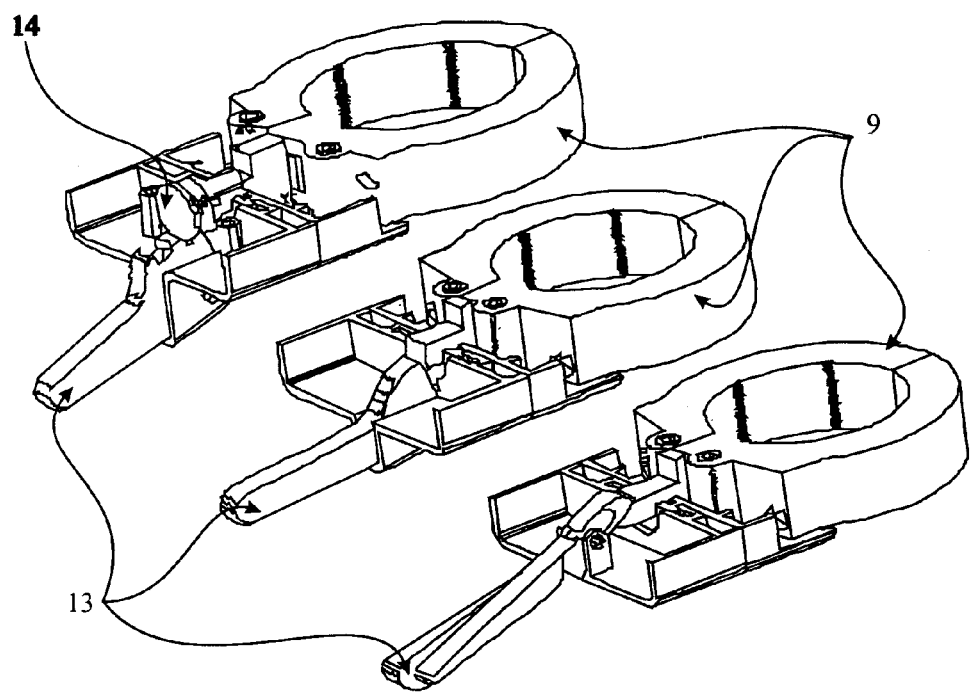
FIGS. 7 and 8 show the various alternatives to the spherical end of the pusher.
Figure 8:
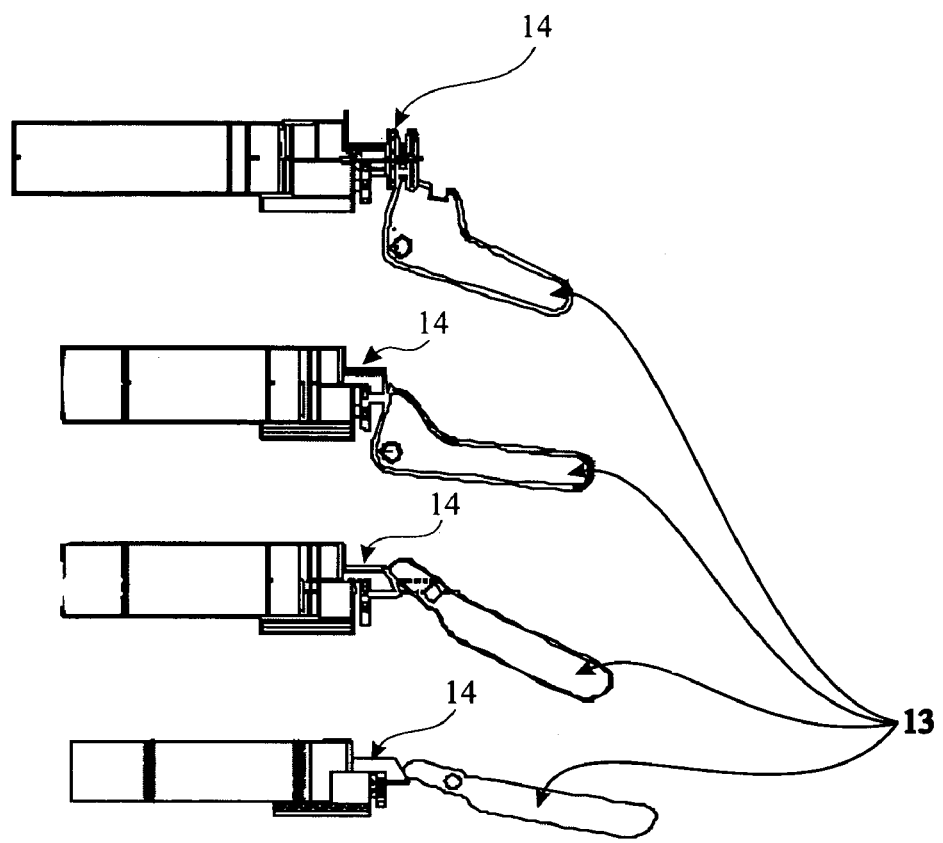

As shown in FIGS. 7 and 8, the trigger-end of the pusher (14) that is pushed by the trigger (13), and the hinge end of the trigger (13) can be of any shape other than spherical, and any other type than solid, said shape selected from a group comprising wedge, multiple wedge, or any other curvilinear shape or a combination thereof, so that the trigger pushes the pusher effectively without any play.

It is clear from FIG. 2 that the jaws rotate and thus open within their own plane, and the jaws as an assembly are able to rotate with respect to the main body (1) of the clamp meter (out of plane rotation).

Figure 9:
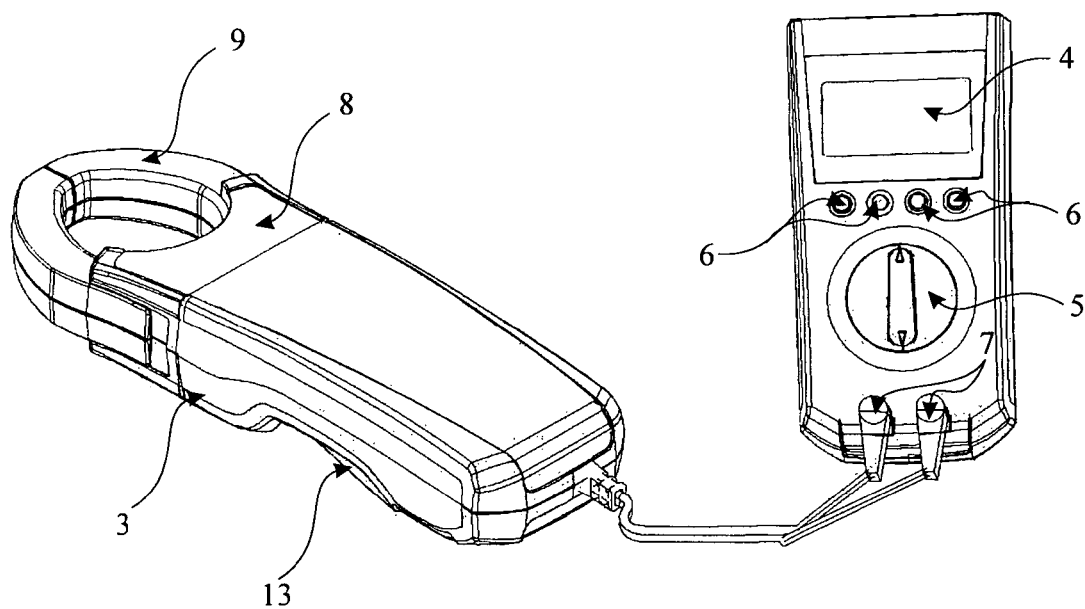
FIGS. 9 and 10 show the split arrangement for the product of the present invention
Figure 10:
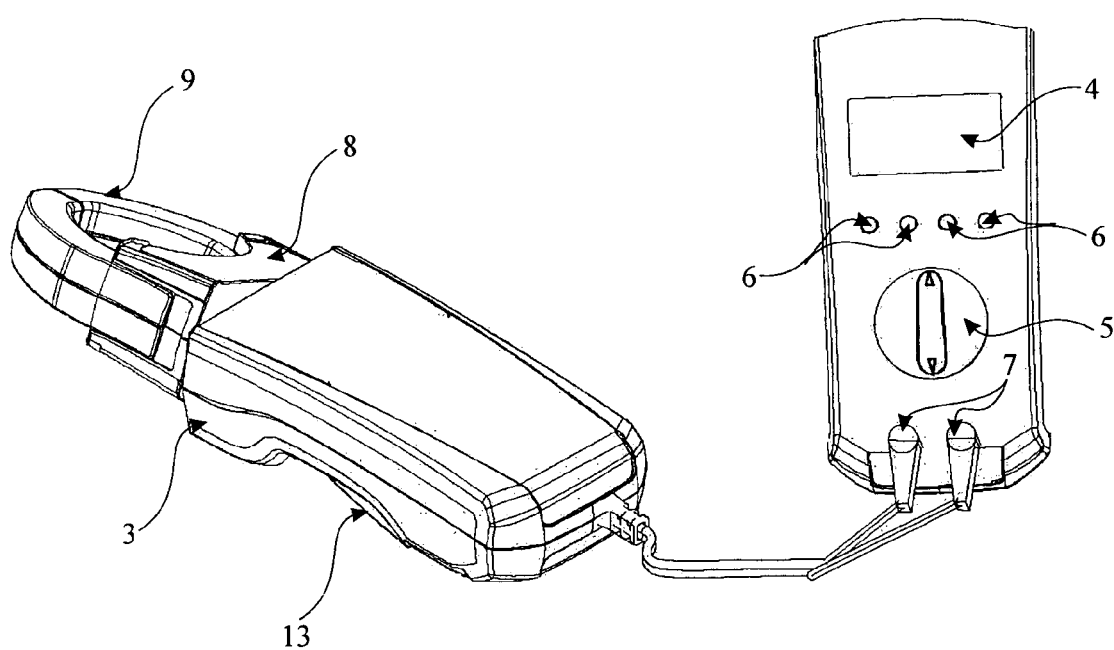

In an embodiment, and as shown in FIGS. 9 and 10, the trigger (13) and the clamp jaws (9) may be housed together in a jaw assembly (or a measuring assembly) that is separate from the control assembly containing the display, function selection switch (5), parameter measuring devices, etc. In this embodiment, the jaw assembly is connected wirelessly or with a physical connection to the measurement assembly. The jaw assembly comprises jaws that are rotatable with respect to the main body (1) of the jaw assembly or fixed at any angle therewith.

In an embodiment of the present invention, the clamp housing (8) along with the contents that are housed inside the clamp housing (8) are rotatable around the longitudinal axis passing through the centre of the pusher (14).

In another embodiment of the present invention, instead of the compression springs, a material with elastic properties is used said material is used in shape of a solid or hollow cylinder or any other suitable shape, and wherein said material is selected from a group comprising rubber, polymer, or any combination thereof.

In yet another embodiment of the present invention, the material used for the trigger, the clamp jaws, the cover and base housings may be any material selected from the group comprising metals, alloys, plastic, rubber, or any other such suitable material, or a combination thereof.

It will be clear from the foregoing description that the present invention comprises the following items:

1. A clamp meter with a safe trigger mechanism, said clamp meter comprising a cover housing, a base housing, a clamp housing, a trigger arrangement, wherein said cover housing and said base housing enclosing a display screen, a function selection switch, and a set of push buttons to select testing parameters electrically connected to the measurement circuitry that is housed in the housings; and wherein said clamp housing houses a plurality of clamp jaws, preferably two clamp jaws, wherein said clamp jaws are connected to said clamp housing through an arrangement comprising a pivot sleeve and a pivot screw for each of the clamps, further wherein said two jaws are connected to each other through a central hinge arrangement wherein each of said two jaws has a loop, the two loops being positioned together axially thereby forming a single opening, through which said opening a pin, made out of metal or any other suitable material such as hard plastic or hard rubber, or wood, passes to form said central hinge arrangement; and further wherein said trigger arrangement comprises:
  a. a trigger arm that has a protruding end and a hinge end; said trigger arm being rotatably connected with the help of a hinge connection to said base housing, said hinge connection comprising a hinge screw and a hinge C-clip;
  b. a pusher with two ends such that said hinge end of the trigger is in contact with the trigger-end of said pusher, the other end of said pusher being simultaneously connected to each of said clamp jaws through said metal pin that is fixedly attached to said other end of said pusher, such that said metal pin operates both of said clamp jaws simultaneously;
  wherein when said trigger is pressed, said protruding end pushes the spherical end of said pusher along its axis, said pusher in turn pushing said metal pin in the same direction; and wherein said pin, through said central hinge arrangement, makes both of said clamp jaws rotate in their own plane, thereby opening them, such that in their open position, said clamp jaws press against the respective compression springs that are provided inside said base housing, and such that upon the release of the trigger, the compression springs push the clamp jaws back into their closed position.

2. A clamp meter as described in item 1, wherein either said hinge-end of said trigger or said trigger-end of said pusher have a profile shape selected from a group comprising wedge shaped, split wedges, flat or any curvilinear surface.

3. A clamp meter as described in items 1 to 2 wherein only one of said jaws is made to rotate through said hinge arrangement.

4. A novel clamp meter as described in items 1 to 3, wherein said trigger may be placed at any positions such as side of the clamp meter, or any other position from where clamp jaws are appropriately worked.

5. A clamp meter as described in items 1 to 4, wherein the trigger is at any location on the face adjacent to the terminal side of the housing.

6. A clamp meter as described in items 1 to 5, wherein said trigger may be placed on the face of the clamp meter where the display is located.

7. A clamp meter as described in items 1 to 6, wherein additionally a rotary mechanism may be provided in order that the clamp jaws can rotate about the longitudinal axis of the clamp meter.

8. A novel clamp meter as described in items 1 to 7, wherein the clamp housing and the clamp jaws and the trigger arrangement form a unit and the measurement mechanism are housed in a separate housing.

9. A novel clamp meter as described in items 1 to 8, wherein instead of each of said compression springs, a material with elastic properties is used said material being used in shape of a solid or hollow cylinder or any other suitable shape, and wherein said material is selected from a group comprising rubber, polymer, or any combination thereof.

10. A novel clamp meter as described in items 1 to 9, wherein the material used for the trigger, the clamp jaws, the cover and base housings may be any material selected from the group comprising metals, alloys, plastic, rubber, or any other such suitable material, or a combination thereof.

11. A novel clamp meter with rotary mechanism substantially as herein described and illustrated in accompanying drawings.

Although the invention has been described with reference to certain preferred embodiments, the invention is not meant to be limited to those preferred embodiments. Alterations to the preferred embodiments described are possible without departing from the spirit of the invention. However, the apparatus described above is intended to be illustrative only, and the novel characteristics of the invention may be incorporated in other structural forms without departing from the scope of the invention.

The invention claimed is:

1. A clamp meter with a safe trigger mechanism, said clamp meter comprising a cover housing, a base housing, a clamp housing, a trigger arrangement, wherein said cover housing and said base housing enclosing a display screen, a function selection switch, and a set of push buttons to select testing parameters electrically connected to the measurement circuitry that is housed in the housings; and wherein said clamp housing houses a plurality of clamp jaws, preferably two clamp jaws, wherein said clamp jaws are connected to said clamp housing through an arrangement comprising a pivot sleeve and a pivot screw for each of the clamps, further wherein said two jaws are connected to each other through a central hinge arrangement wherein each of said two jaws has a loop, the two loops being positioned together axially thereby forming a single opening, through which said opening a pin, made out of metal or any other suitable material such as hard plastic or hard rubber, or wood, passes to form said central hinge arrangement; and further wherein said trigger arrangement comprises:
  a. a trigger arm that has a protruding end and a hinge end; said trigger arm being rotatably connected with the help of a hinge connection to said base housing, said hinge connection comprising a hinge screw and a hinge C-clip;
  b. a pusher with two ends such that said hinge end of the trigger is in contact with the trigger-end of said pusher, the other end of said pusher being simultaneously connected to each of said clamp jaws through said metal pin that is fixedly attached to said other end of said pusher, such that said metal pin operates both of said clamp jaws simultaneously;
  wherein when said trigger is pressed, said protruding end pushes the spherical end of said pusher along its axis, said pusher in turn pushing said metal pin in the same direction; and wherein said pin, through said central hinge arrangement, makes both of said clamp jaws rotate in their own plane, thereby opening them, such that in their open position, said clamp jaws press against the respective compression springs that are provided inside said base housing, and such that upon the release of the trigger, the compression springs push the clamp jaws back into their closed position.

2. A clamp meter as claimed in claim 1, wherein either said hinge-end of said trigger or said trigger-end of said pusher have a profile shape selected from a group comprising wedge shaped, split wedges, flat or any curvilinear surface.

3. A clamp meter as claimed in claim 2, wherein only one of said jaws is made to rotate through said hinge arrangement.

4. A clamp meter as claimed in claim 3, wherein said trigger may be placed at any positions such as side of the clamp meter, or any other position from where clamp jaws are appropriately worked.

5. A clamp meter as claimed in claim 4, wherein the trigger is at any location on the face adjacent to the terminal side of the housing.

6. A clamp meter as claimed in claim 5, wherein said trigger may be placed on the face of the clamp meter where the display is located.

7. A clamp meter as claimed in claim 6, wherein additionally a rotary mechanism may be provided in order that the clamp jaws can rotate about the longitudinal axis of the clamp meter.

8. A clamp meter as claimed in claim 7, wherein the clamp housing and the clamp jaws and the trigger arrangement form a unit and the measurement mechanisms are housed in a separate housing.

9. A clamp meter as claimed in claim 8, wherein instead of each of said compression springs, a material with elastic properties is used said material being used in shape of a solid or hollow cylinder or any other suitable shape, and wherein said material is selected from a group comprising rubber, polymer, or any combination thereof.

10. A clamp meter as claimed in claim 9, wherein the material used for the trigger, the clamp jaws, the cover and base housings may be any material selected from the group comprising metals, alloys, plastic, rubber, or any other such suitable material, or a combination thereof.

* * * * *